US010818803B1

(12) United States Patent
Frougier et al.

(10) Patent No.: US 10,818,803 B1
(45) Date of Patent: Oct. 27, 2020

(54) FIN-TYPE FIELD-EFFECT TRANSISTORS INCLUDING A TWO-DIMENSIONAL MATERIAL

(71) Applicant: GLOBALFOUNDRIES Inc., Grand Cayman (KY)

(72) Inventors: Julien Frougier, Albany, NY (US); Ali Razavieh, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/516,623

(22) Filed: Jul. 19, 2019

(51) Int. Cl.
*H01L 21/00* (2006.01)
*H01L 27/00* (2006.01)
*H01L 29/00* (2006.01)
*H01L 29/786* (2006.01)
*H01L 29/10* (2006.01)
*H01L 21/8238* (2006.01)
*H01L 27/088* (2006.01)
*H01L 29/16* (2006.01)

(52) U.S. Cl.
CPC .......... *H01L 29/78696* (2013.01); *H01L 21/823828* (2013.01); *H01L 27/0886* (2013.01); *H01L 29/1054* (2013.01); *H01L 29/1606* (2013.01); *H01L 2924/055* (2013.01)

(58) Field of Classification Search
CPC .......... H01L 21/823828; H01L 21/845; H01L 21/8213; H01L 21/823431; H01L 21/8238; H01L 27/0886; H01L 27/10826; H01L 27/10879; H01L 27/2254; H01L 29/78696; H01L 29/1054; H01L 29/1606; H01L 2924/055
See application file for complete search history.

(56) References Cited

U.S. PATENT DOCUMENTS

| 5,961,923 | A | 10/1999 | Nova et al. |
| 6,340,588 | B1 | 1/2002 | Nova et al. |
| 9,136,153 | B2 | 9/2015 | Or-Bach et al. |
| 10,134,915 | B2 | 11/2018 | Colinge et al. |
| 2016/0005849 | A1* | 1/2016 | Li .................... H01L 29/7783 257/24 |
| 2017/0317206 | A1 | 11/2017 | van Dal et al. |
| 2018/0182898 | A1 | 6/2018 | Moroz et al. |

OTHER PUBLICATIONS

Julien Frougier et al., "Nanosheet Field-Effect Transistors Including a Two-Dimensional Semiconducting Material" filed May 30, 2018 as U.S. Appl. No. 15/992,942.

* cited by examiner

*Primary Examiner* — Nikolay K Yushin
(74) *Attorney, Agent, or Firm* — Thompson Hine LLP; Francois Pagette

(57) ABSTRACT

Structures for a field-effect transistor and methods of forming structures for a field-effect transistor. A source/drain region is connected with a channel layer, and a gate structure extends across the channel layer. The channel layer is composed of a two-dimensional material.

20 Claims, 16 Drawing Sheets

US 10,818,803 B1

FIN-TYPE FIELD-EFFECT TRANSISTORS INCLUDING A TWO-DIMENSIONAL MATERIAL

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be used to build a combination of p-type and n-type field-effect transistors that are used to construct, for example, logic cells. Field-effect transistors generally include a semiconductor body including a channel region, a source, a drain, and a gate electrode over the body. When a control voltage exceeding a characteristic threshold voltage is applied to the gate electrode, carrier flow occurs in the channel region between the source and drain to produce a device output current.

A fin-type field-effect transistor (FinFET) is a non-planar device structure that may be more densely packed in an integrated circuit than planar field-effect transistors. A fin-type field-effect transistor may include a fin providing the semiconductor body, a gate electrode that wraps about the fin, and heavily-doped source/drain regions spaced along the fin and arranged on opposite sides of the gate electrode.

Fin-type field-effect transistors may encounter difficulty in scaling because reductions in the fin thickness of the reach a point at which quantum confinement significantly degrade performance. In addition, short channel effects may limit the ability to continue to shrink the gate length. As such, limits over electrostatic control for fin-type field-effect transistors may limit scaling.

Improved structures for a field-effect transistor and methods of forming a structure for a field-effect transistor are needed.

SUMMARY

In embodiments of the invention, a structure is provided for a field-effect transistor. The structure includes a channel layer, a source/drain region connected with the channel layer, and a gate structure extending across the channel layer. The channel layer includes a portion of a layer of a two-dimensional material.

In embodiments of the invention, a method is provided for forming a field-effect transistor. The method includes forming a sacrificial fin, thinning a portion of the sacrificial fin to form a channel layer, and forming a gate structure that extends across the channel layer. After forming the gate structure, the sacrificial fin is removed to form a space. The method further includes depositing a portion of a layer of a two-dimensional material in the space to form a replacement channel layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
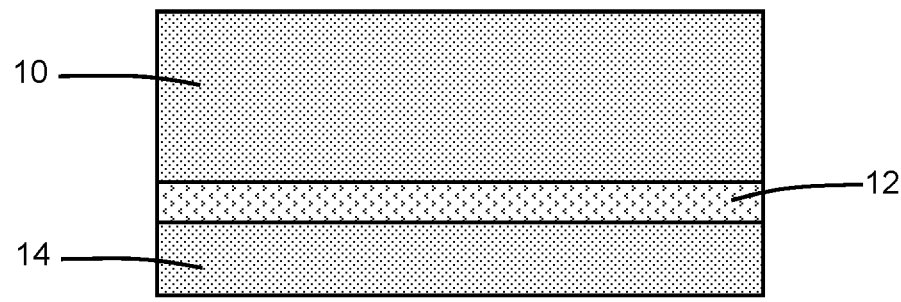
FIG. 1 is a cross-sectional of a device structure at an initial fabrication stage of a processing method in accordance with embodiments of the invention.
Figure 2:
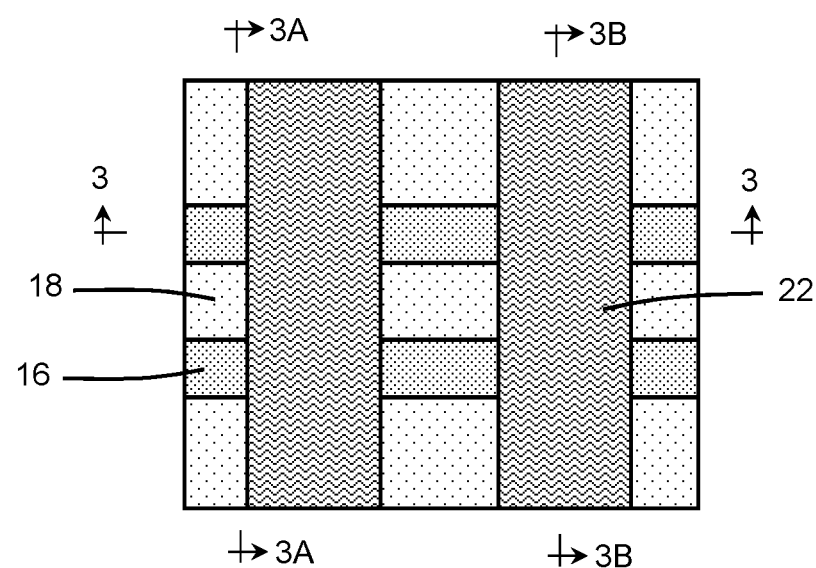
FIG. 2 is a top view of the device structure at a fabrication stage of the processing method subsequent to FIG. 1.
Figure 3:
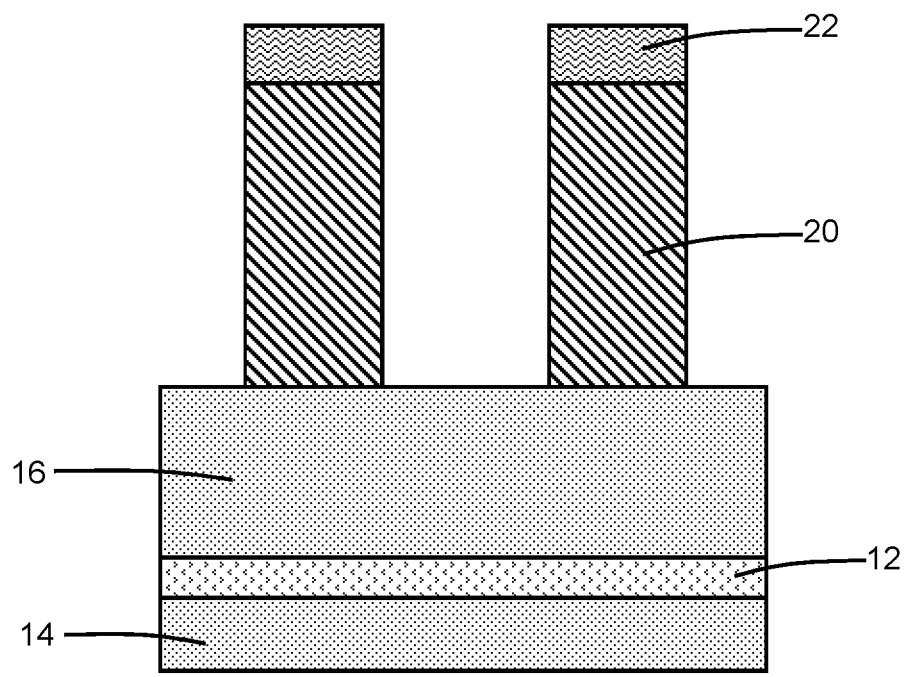
FIG. 3 is a cross-sectional view taken generally along line 3-3 in FIG. 2.
Figure 3A:
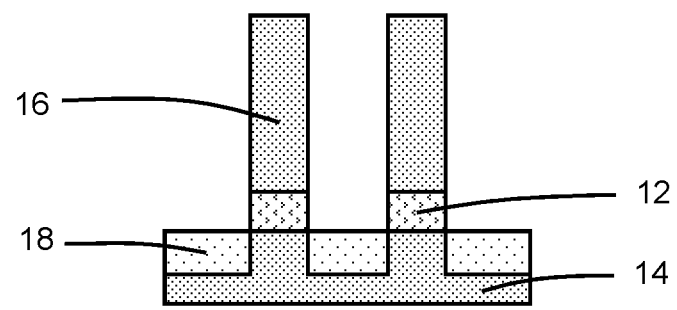
FIG. 3A is a cross-sectional view taken generally along line 3A-3A in FIG. 2.
Figure 3B:
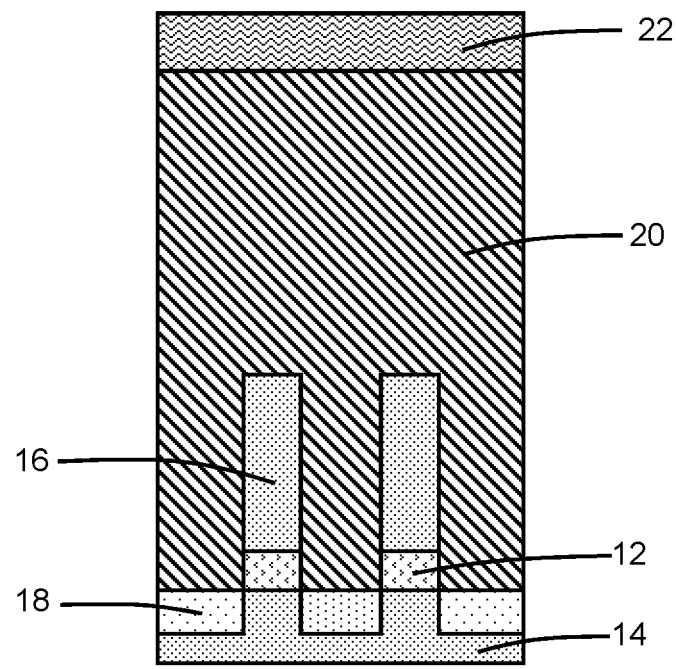
FIG. 3B is a cross-sectional view taken generally along line 3B-3B in FIG. 2.
Figure 4:
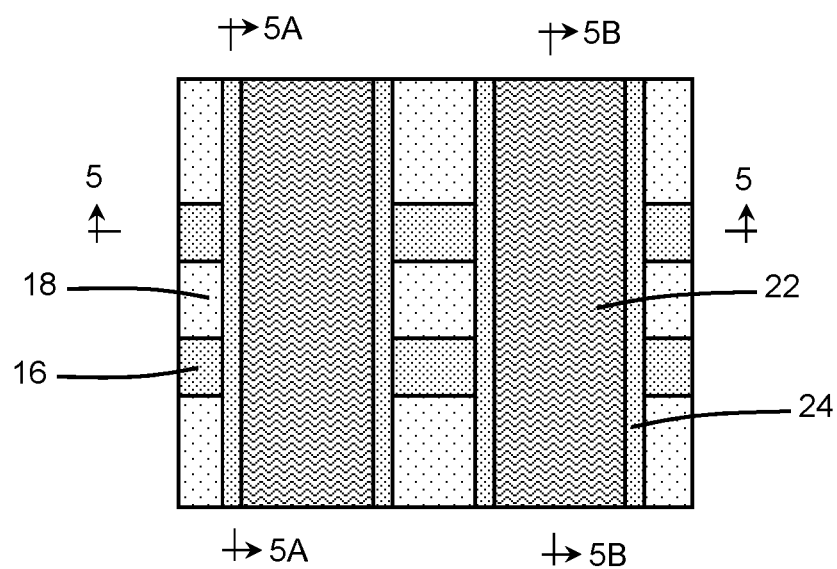
FIG. 4 is a top view of the device structure at a fabrication stage of the processing method subsequent to FIG. 1.

With reference to FIG. 1 and in accordance with embodiments of the invention, a layer 10 and a layer 12 are formed over a substrate 14. The layers 10, 12 and the substrate 14 may be composed of a single-crystal semiconductor material. The layer 12 is composed of a semiconductor material with a composition that is selected to be removed selective to the semiconductor material of the layer 10 and to the semiconductor material of the substrate 14. The respective compositions of the layers 10, 12 are chosen during epitaxial growth. For example, the layer 10 and the substrate 14 may be composed of single-crystal silicon, and the layer 12 may be composed of single-crystal silicon-germanium with a germanium content (e.g., 50% germanium) that etches at a higher rate than silicon due to the germanium content. The layers 10, 12 may be formed by an epitaxial growth process that relies on the crystal structure of the substrate 14 as a growth template and that modulates the source gases during growth to provide the composition change. In an alternative embodiment, the layer 12 is optional and may be omitted from the layer stack.

With reference to FIGS. 2, 3, 3A, 3B in which like reference numerals refer to like features in FIG. 1 and at a subsequent fabrication stage, fins 16 are formed by patterning the layer 10 with lithography and etching processes or by a self-aligned multi-patterning process. The layer 12 is also patterned to include sections that are respectively positioned between the fins 16 and the substrate 14. Shallow trench isolation regions 18 are formed in the spaces between the fins 16. The shallow trench isolation regions 18 may be formed by etching recesses in the substrate 14 during fin formation, depositing a layer composed of a dielectric material, such as silicon dioxide, in the recesses, and recessing the deposited layer with an etching process. The fins 16 represent sacrificial structures providing placeholders for subsequent process steps.

Sacrificial gate structures 20 are formed that overlap with, and wrap around, a portion of each fin 16. The sacrificial gate structures 20 have a spaced-apart arrangement along the length of the fins 16 and are aligned transverse to the longitudinal axes of the fins 16. The sacrificial gate structures 20 may include a thin oxide layer immediately adjacent to the exterior surface of the fins 16 and a thicker layer containing a sacrificial material, such as amorphous silicon. The sacrificial gate structures 20 may be patterned by lithography and etching processes from these constituent layers with reactive ion etching (RIE) using a hardmask. The sacrificial gate structures 20 are each covered by a hardmask cap 22. The hardmask cap 22 may include one or more dielectric materials, such as silicon nitride, and may be a remnant of the hardmask from the lithography and etching processes used to form the sacrificial gate structures 20.

With reference to FIGS. 4, 5, 5A, 5B in which like reference numerals refer to like features in FIGS. 2, 3, 3A, 3B and at a subsequent fabrication stage, the sections of the layer 12 may be removed by a selective etching process to create spaces beneath the fins 16. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Sidewall spacers 24 are formed adjacent to the sidewalls of the sacrificial gate structures 20. The sidewall spacers 24 may be formed by depositing a conformal layer composed of a dielectric material, such as a low-k dielectric material (e.g., SiBCN, SiOC, or SiOCN), and etching the deposited conformal layer with an anisotropic etching process, such as reactive ion etching. Portions of the conformal layer fill the spaces created by the removal of the patterned sections of the layer 12 to define a bottom dielectric isolation layer 26 below the fins 16. Recesses 25 may be formed in the fins 16 by an etching process that is self-aligned by the sidewall spacers 24 and sacrificial gate structures 20.

In an alternative embodiment, the layers 10, 12 may be replaced by layers composed of different materials with etch selectivity such that layer 12 may be removed selective to layer 10. For example, the layer 10 may be composed of a dielectric material, such as silicon carbide, and the layer 12 may be composed of a different dielectric material, such as silicon nitride. After forming the fins 16 from the layer 10 and removing the sections of the layer 12 from beneath the fins 16, portions of the bottom dielectric isolation layer 26 deposit in the spaces created by the removal of the sections of the layer 12. The fins 16, which are sacrificial, are positioned over the bottom dielectric isolation layer 26. The substrate 14 is not restricted to being formed from a single-crystal semiconductor material because the layers 10, 12 may be deposited without the necessity of an epitaxial growth process. In that regard, the substrate 14 may be formed from other types of materials, such as glass or fused quartz, a ceramic, sapphire, zinc oxide, aluminum nitride, etc.

Figure 5:
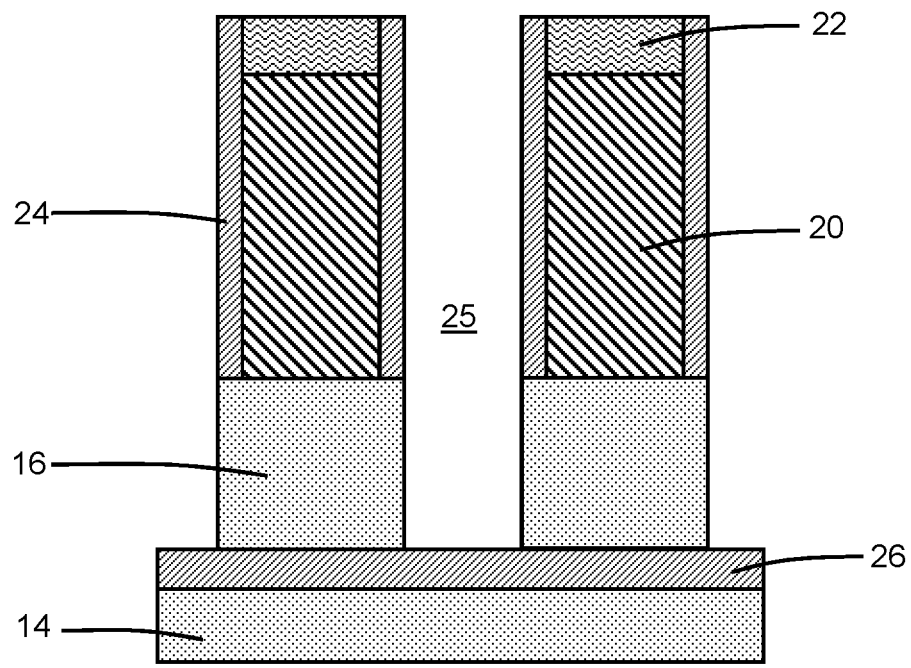
FIG. 5 is a cross-sectional view taken generally along line 5-5 in FIG. 4.
Figure 5A:
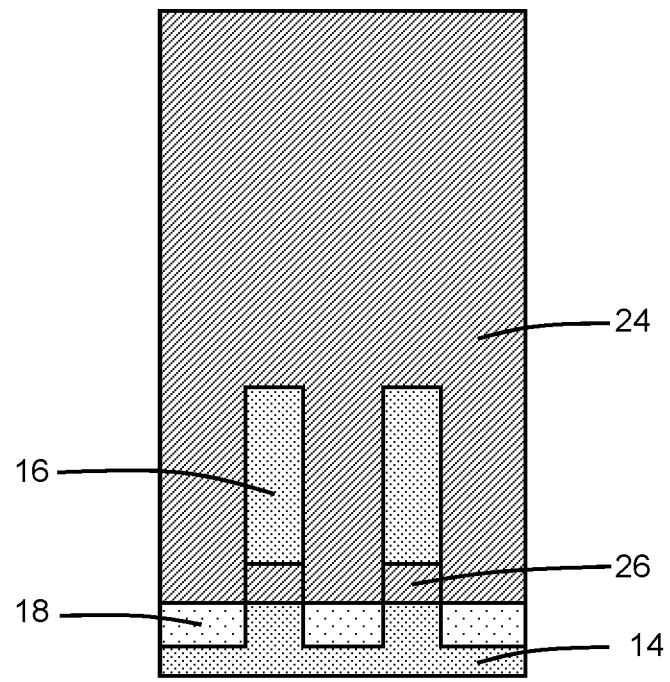
FIG. 5A is a cross-sectional view taken generally along line 5A-5A in FIG. 4.
Figure 5B:
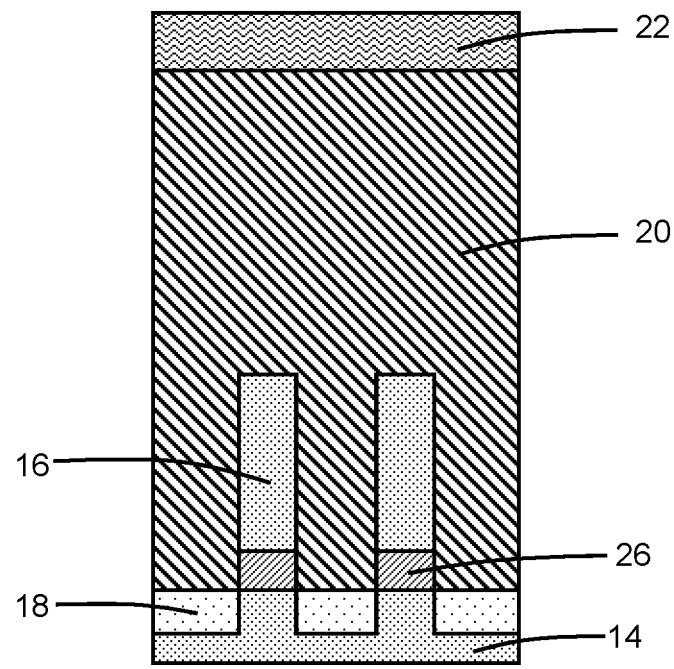
FIG. 5B is a cross-sectional view taken generally along line 5B-5B in FIG. 4.
Figure 6:
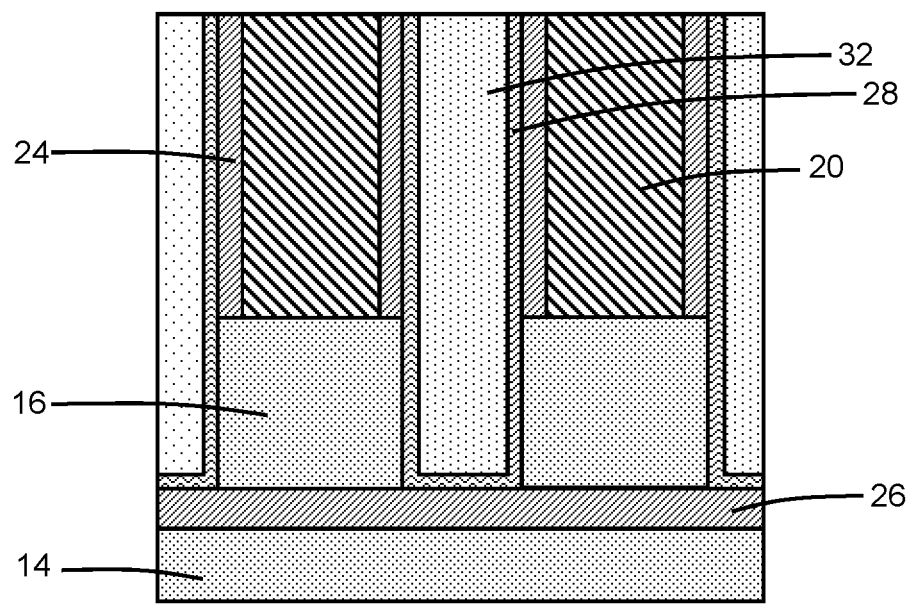
FIGS. 6-12, 6A-12A, and 6B-12B are cross-sectional views of the device structure at successive fabrication stages of the processing method respectively subsequent to FIGS. 5, 5A, and 5B.
Figure 6A:
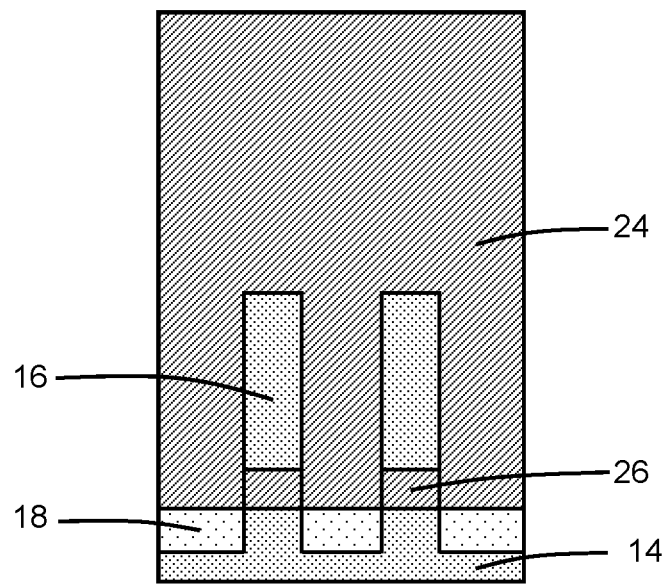
Figure 6B:
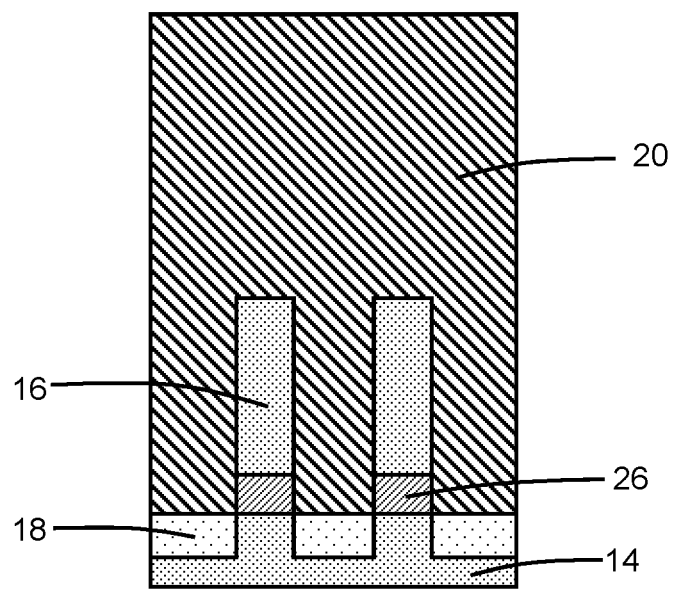

With reference to FIGS. 6, 6A, 6B in which like reference numerals refer to like features in FIGS. 5, 5A, 5B and at a subsequent fabrication stage, a conformal liner 28 may be formed over the fins 16 and sacrificial gate structures 20. The conformal liner 28 may be formed by depositing a conformal layer composed of a dielectric material, such as silicon nitride, deposited by atomic layer deposition. An interlayer dielectric layer 32 is deposited as fill material and planarized by chemical mechanical polishing. The interlayer dielectric layer 32 may be composed of a dielectric material, such as silicon dioxide, deposited by chemical vapor deposition. The planarization may remove the hardmask caps 22 from the sacrificial gate structures 20 and thereby reveal the sacrificial gate structures 20. The conformal liner 28 and interlayer dielectric layer 32 collectively fill each of the recesses 25 (FIG. 5).

Figure 7:
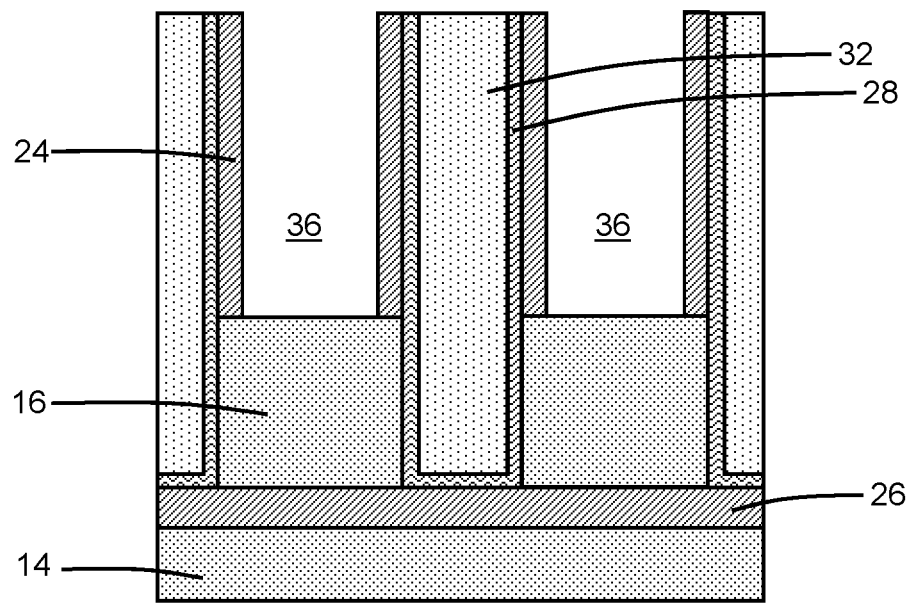
Figure 7A:
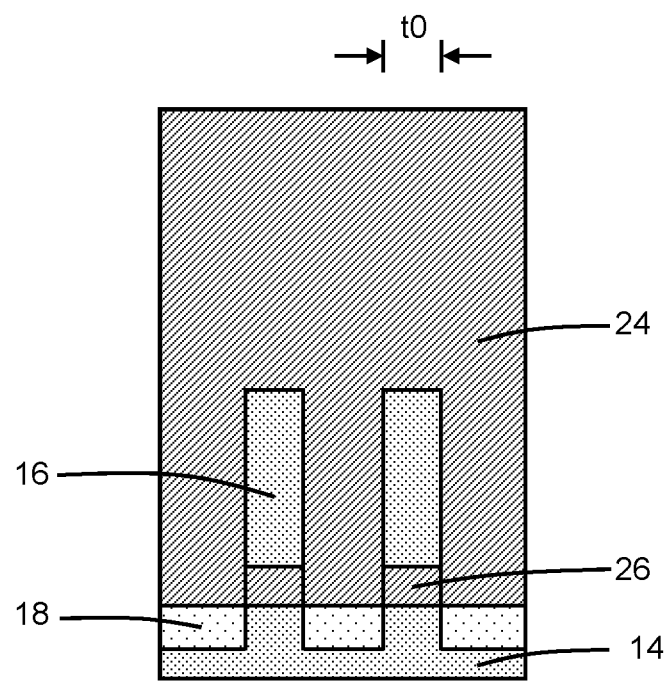
Figure 7B:
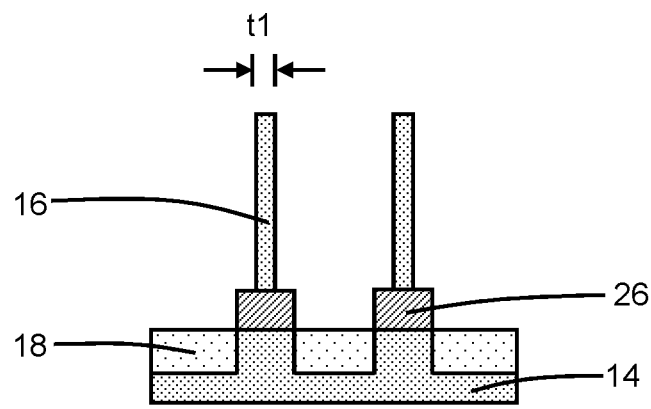

With reference to FIGS. 7, 7A, 7B in which like reference numerals refer to like features in FIGS. 6, 6A, 6B and at a subsequent fabrication stage, the sacrificial material and thin oxide layer of the sacrificial gate structures 20 are removed with one or more etching processes. The removal of the sacrificial gate structures 20 opens spaces 36 between the sidewall spacers 24. The spaces 36 expose respective channel regions of the fins 16.

As best shown in FIG. 7B, the fins 16 are thinned to a given thickness, t1, in the channel regions exposed by the spaces 36. In an embodiment, the channel regions of the fins 16 may be thinned by a cyclic oxidation and etching process in which a small increment of the total fin thickness is oxidized in each cycle and then the thin oxide is removed with a selective etching process. In an embodiment, the channel regions of the fins 16 may be thinned to a thickness of about two nanometers to about three nanometers. The fins 16 are not removed in conjunction with the thinning.

As best shown in FIG. 7A, portions of the fins 16 covered by the sidewall spacers 24 are not thinned and retain the original thickness, t0. The sidewall spacers 24 anchor the fins 16 so that the thinned channel regions are mechanically stable. Although not shown, the top surface of the thinned channel regions of the fins 16 may also be recessed slightly by the cyclic oxidation and etching process.

Figure 8:
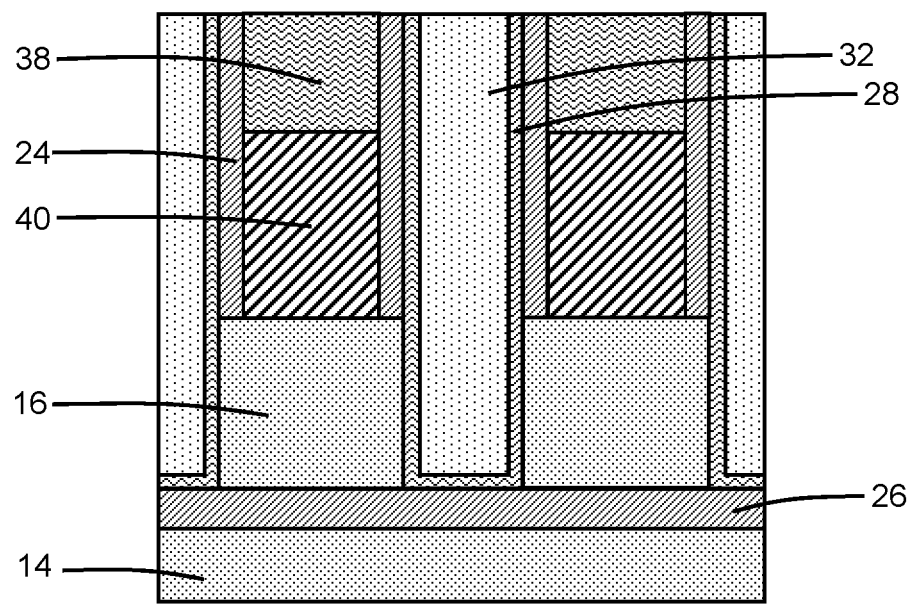
Figure 8A:
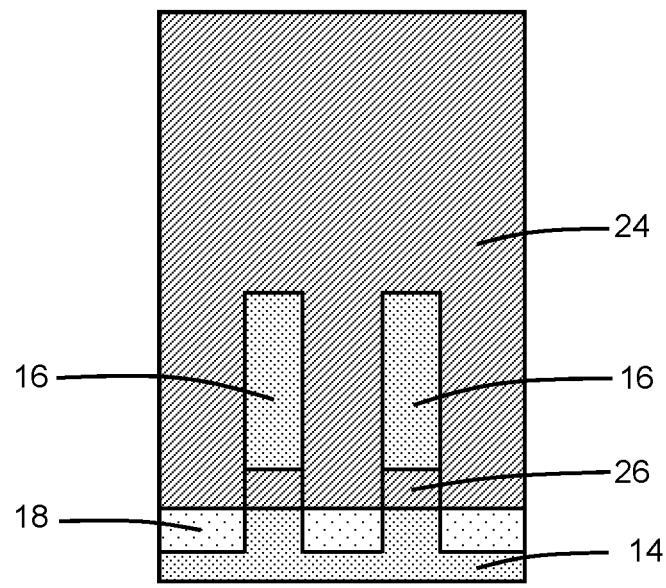
Figure 8B:
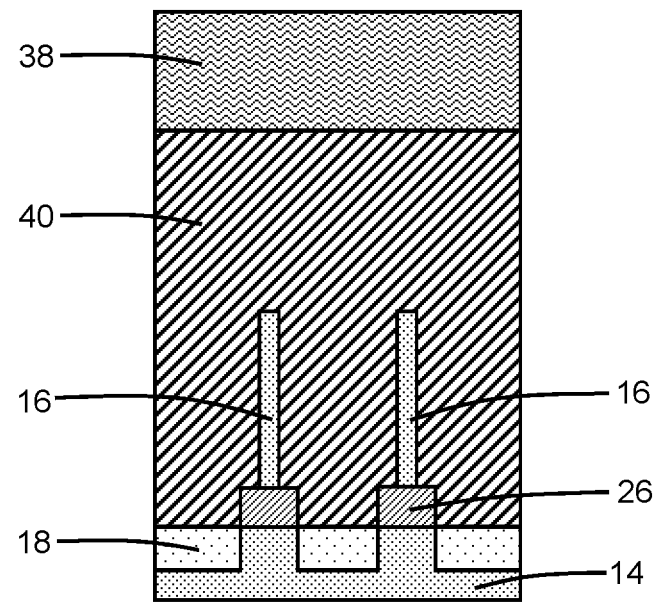

With reference to FIGS. 8, 8A, 8B in which like reference numerals refer to like features in FIGS. 7, 7A, 7B and at a subsequent fabrication stage, gate structures 40 are formed as part of a replacement gate process after removing the sacrificial gate structures 20. Each gate structure 40 may include an interface layer, a gate dielectric layer, and a metal gate electrode as a gate stack. The interface layer coats the channel region of the fins 16, and the gate dielectric layer is arranged in the gate stack between the metal gate electrode and the interface layer. Gate caps 38 are formed in the spaces between the sidewall spacers 24 over each of the gate structures 40.

The interface layer of the gate structures 40 may be composed of a dielectric material, such as a silicon dioxide. The gate dielectric layer of the gate structures 40 may be composed of a dielectric material, such as a high-k dielectric material like hafnium oxide. The metal gate electrode of the gate structures 40 includes one or more conformal barrier metal layers and/or work function metal layers, such as layers composed of titanium aluminum carbide and/or titanium nitride, and a metal gate fill layer composed of a conductor, such as tungsten. The gate caps 38 may be composed of a dielectric material, such as silicon nitride.

Figure 9:
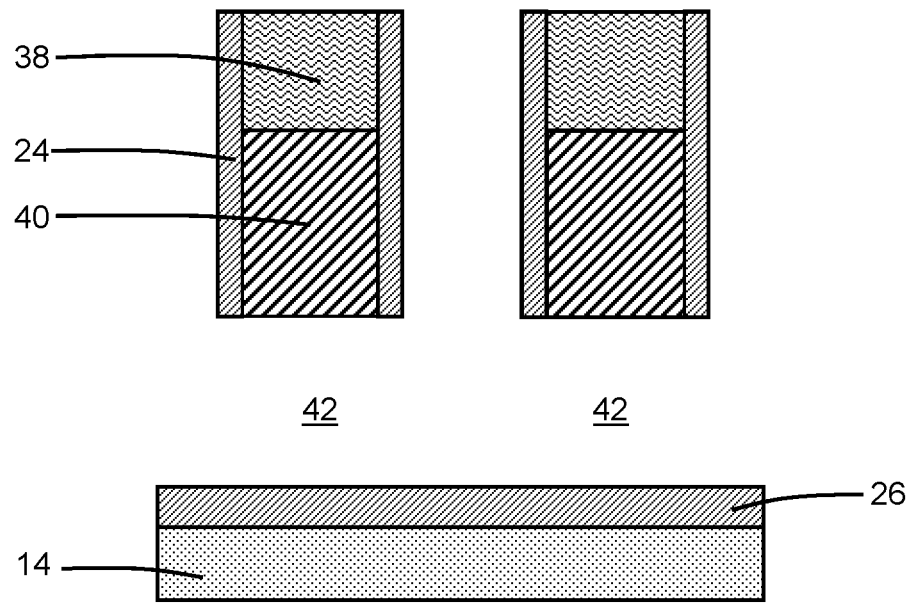
Figure 9A:
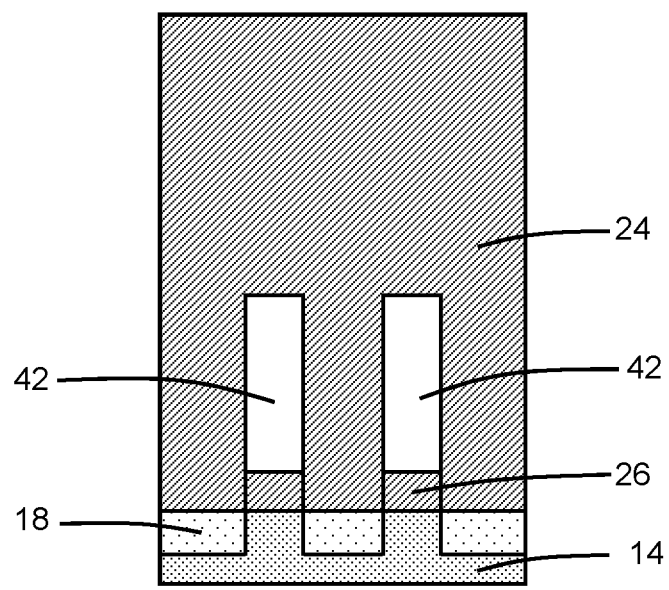
Figure 9B:
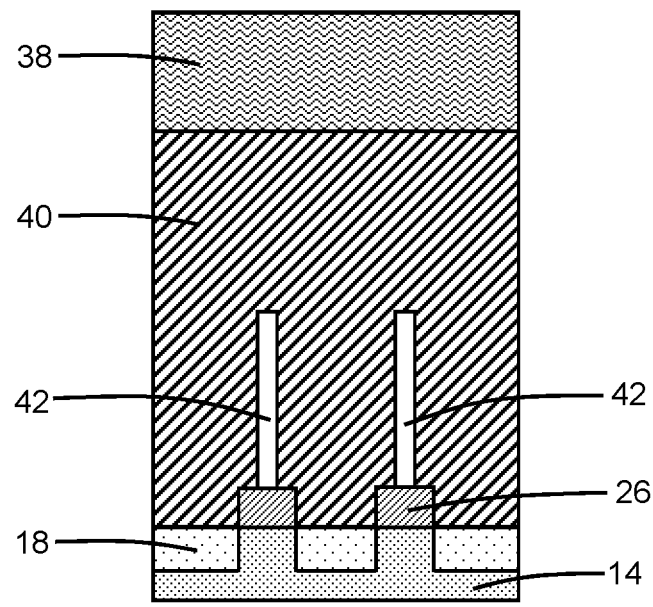

With reference to FIGS. 9, 9A, 9B in which like reference numerals refer to like features in FIGS. 8, 8A, 8B and at a subsequent fabrication stage, after forming the gate structures 40, the interlayer dielectric layer 32 is removed with an etching process, such as a reactive ion etching process, which exposes the conformal layer 32. The exposed conformal layer 32 is removed with an etching process, such as a wet chemical etching process using a heated solution containing phosphoric acid ($H_3PO_4$). The removal of the conformal layer 32 exposes the exterior surfaces of the fins 16, which provides access for their subsequent removal.

The fins 16 are fully removed by an etching process selective to the bottom dielectric isolation layer 26 and the gate structures 40. For example, the etching process may be a remote plasma-assisted dry etch process that exposes the fins 16 to radicals (i.e., uncharged or neutral species) generated from a gas mixture of nitrogen triflouride ($NF_3$) and hydrogen ($H_2$).

The removal of the fins 16 generates spaces 42 that may have the dimension of the removed fins 16. The spaces 42 have portions of different widths due to the different widths of the fins 16. As best shown in FIG. 9B, a channel portion of each space 42 is covered and surrounded on three sides by one of the gate structures 40, and the channel portion of each space 42 has dimensions equal to the thinned channel regions of the fins 16 that were removed. Replacement channel regions are subsequently formed in the channel portion of each space 42. As best shown in FIG. 9A, each space 42 also includes extension portions that are covered and surrounded on three sides by the sidewall spacers 24, and the extension portions of each space 42 have dimensions equal to the unthinned regions of the fins 16 that were removed. The channel portion of each space 42 is narrower than the adjacent extension portions of each space 42. For example, the channel portion of each space 42 may have a width on the order of about two nanometers to about three nanometers.

Figure 10:
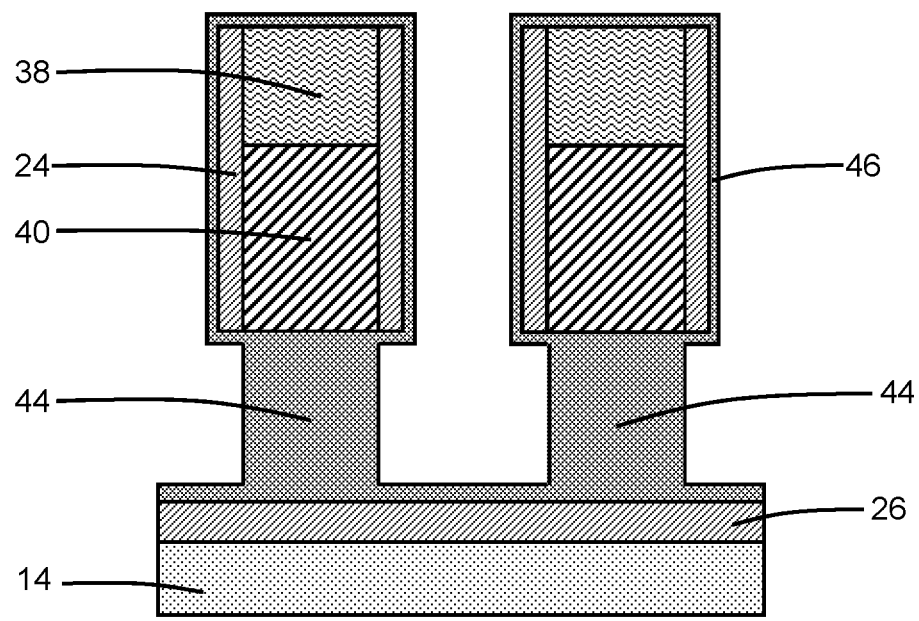
Figure 10A:
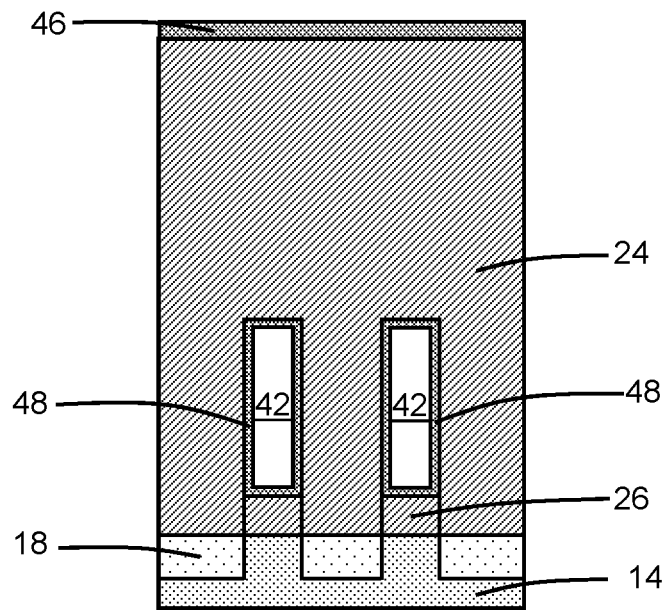
Figure 10B:
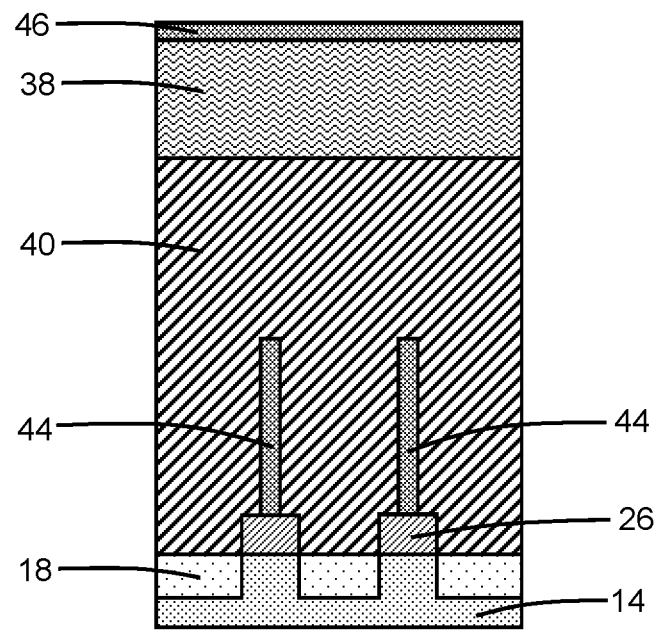

With reference to FIGS. 10, 10A, 10B in which like reference numerals refer to like features in FIGS. 9, 9A, 9B and at a subsequent fabrication stage, a two-dimensional (2D) material is conformally deposited that at least partially fills each of the spaces 42 and that forms a layer 46 that wraps about the sidewall spacers 24 and the gate caps 38, as well as forms on the bottom dielectric isolation layer 26. The channel portion of each space 42, which is covered and surrounded on three sides by one of the gate structures 40, may be filled to define a replacement channel layer 44. In an embodiment, the two-dimensional material may fully fill the channel portion of the spaces 42 to form the replacement channel layers 44 such that the replacement channel layers 44 have a thickness equal to the width of the channel portions of the spaces 42. The extension portions of each space 42 are only partially filled to define extension regions 48 composed of the two-dimensional material. The extension regions 48 couple each replacement channel layer 44 with the layer 46. The replacement channel layers 44 are in direct contact with the bottom isolation layer 26, and the replacement channel layers 44 project in an upward direction away from the bottom isolation layer 26 and the substrate 14 beneath the bottom isolation layer 26.

The two-dimensional material may be a thin conformal coating that is deposited by, for example, atomic layer deposition or chemical vapor deposition, preferably at a temperature of less than 500° C. (e.g., within a range of 450° C. to 500° C.) to restrict metal diffusion in the gate structures 40. In an embodiment, the two-dimensional material may be composed of a transition metal dichalcogenide that includes a transition metal (e.g., molybdenum (Mo) or tungsten (W)) and a chalcogen atom (sulphur (S), selenium (Se), or tellurium (Te)). Exemplary transition metal dichalcogenides include, but are not limited to, molybdenum disulphide ($MoS_2$), hafnium disulfide ($HfS_2$), zirconium disulfide ($ZrS_2$), tungsten disulfide ($WS_2$), tin sulfide (SnS), and tungsten diselenide ($WSe_2$). In an alternative embodiment, the two-dimensional material may be composed of graphene (C). In an alternative embodiment, the two-dimensional material may be characterized by a carrier mobility that is greater than the carrier mobility of silicon. In an embodiment, the two-dimensional material and, in particular, the two-dimensional material contained in each of the replacement channel layers 44 may include a single monolayer of atoms arranged in a thin sheet. In an embodiment, the two-dimensional material may pinch off inside the channel portion of each space 42 during deposition to form the replacement channel layers 44. In an embodiment, each replacement channel layer 44 may contain one monolayer to two monolayers of the two-dimensional material.

Figure 11:
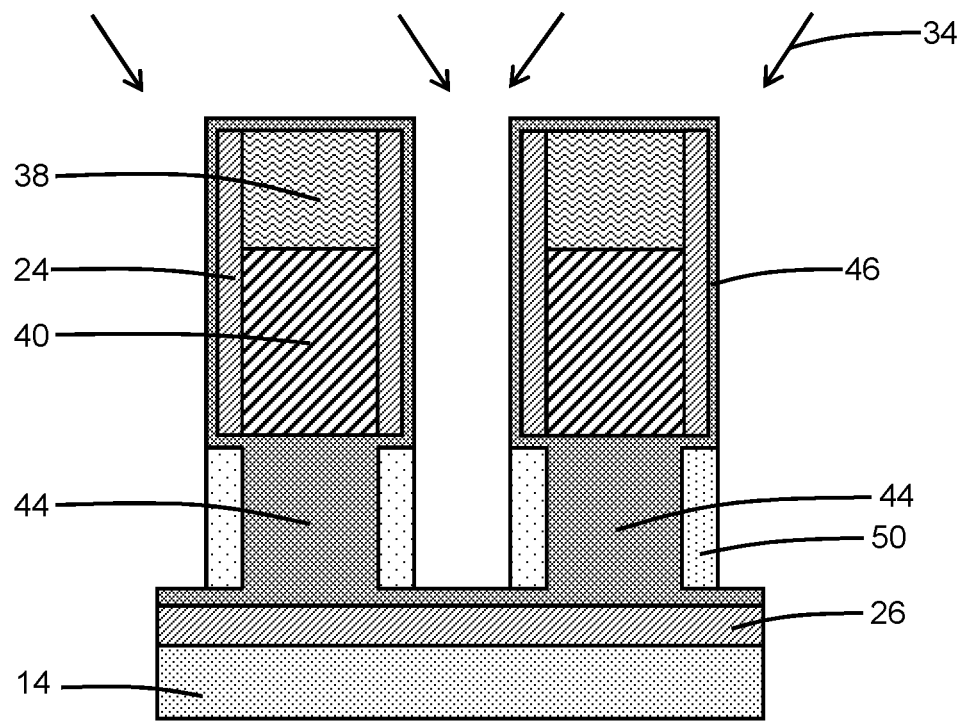
Figure 11A:
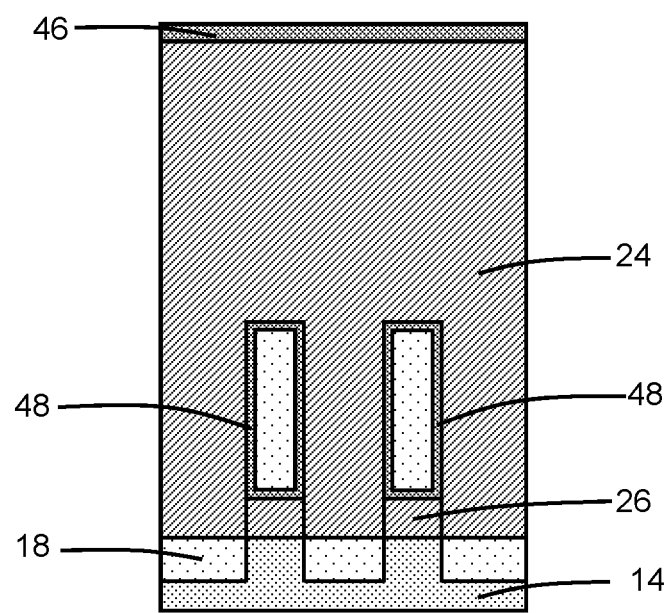
Figure 11B:
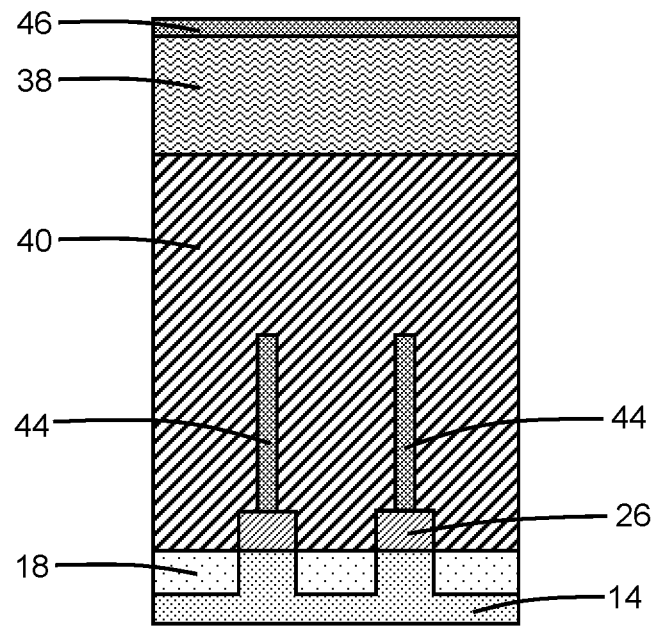

With reference to FIGS. 11, 11A, 11B in which like reference numerals refer to like features in FIGS. 10, 10A, 10B and at a subsequent fabrication stage, inner spacers 50 are formed by depositing a conformal layer of dielectric material, such as silicon dioxide, in the portions of the spaces 42 that are not filled by the two-dimensional material and then performing an anisotropic etching process to remove the conformal layer from outside of the spaces 42. The inner spacers 50 are located in the extension portions of the space 42, and the inner spacers 50 are covered and surrounded on three sides by the sidewall spacers 24 and the extension regions 48 intervening between the inner spacers 50 and sidewall spacers 24. The extension regions 48 define a shell that surrounds the inner spacers 50 on all sides, and the inner spacers 50 provide an inner core of dielectric material surrounded on all sides by the extension regions 48.

The two-dimensional material in the layer 46 may be doped, as diagrammatically indicated by the single-headed arrows labeled with reference numeral 34 in FIG. 11, to increase its electrical conductivity. In an embodiment, the two-dimensional material in the layer 46 may be doped following its deposition. In an embodiment, the two-dimensional material in the layer 46 may be doped by a non-destructive process, such as by a plasma doping process. In an embodiment, the two-dimensional material in the layer 46 may be doped with a p-type dopant from Group III of the Periodic Table (e.g., boron) that provides p-type electrical conductivity. In an embodiment, the two-dimensional material in the layer 46 may be doped with an n-type dopant from Group V of the Periodic Table (e.g., phosphorus and/or arsenic) that provides n-type electrical conductivity.

Figure 12:
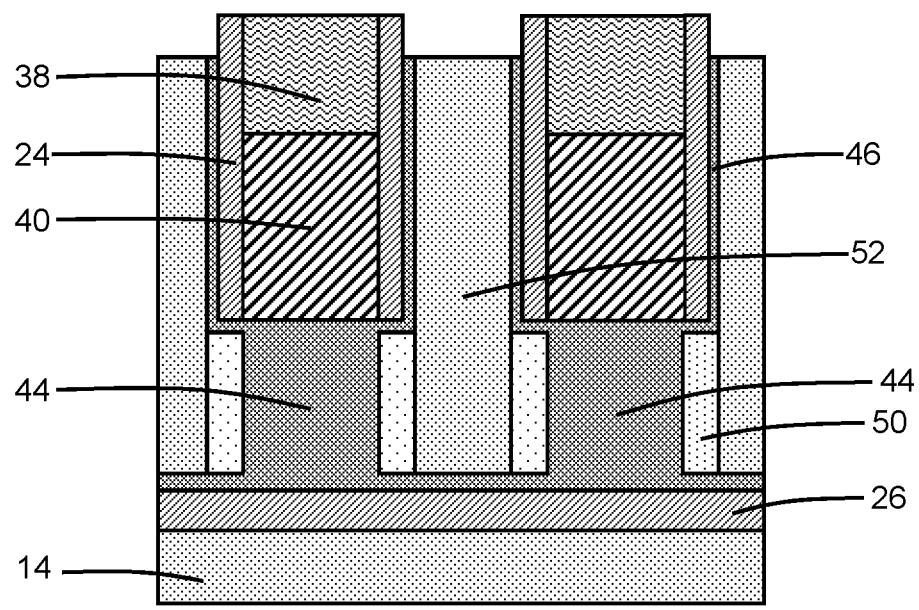
Figure 12A:
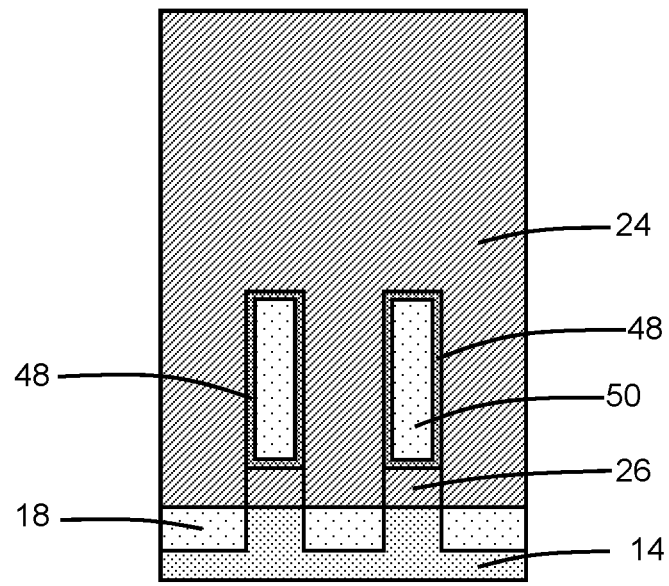
Figure 12B:
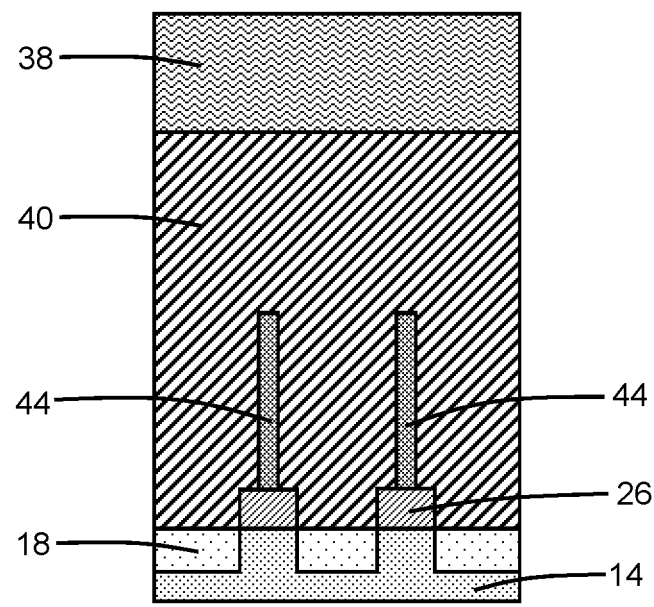

With reference to FIGS. 12, 12A, 12B in which like reference numerals refer to like features in FIGS. 11, 11A, 11B and at a subsequent fabrication stage, source/drain contacts 52 are formed that are coupled with the two-dimensional material in the layer 46. The source/drain contacts 52 may contain a conductor, such as a metal like tungsten or titanium nitride, that is deposited and recessed with an etch-back process. The two-dimensional material in the layer 46, which may be doped, wraps around the conductor contained in each source/drain contact 52. This relationship maximizes the contact area, which may reduce the source/drain contact resistance.

The layer 46 may be chamfered, after forming the source/drain contacts 52, using an isotropic etching process. The different disconnected sections of the layer 46 provide source/drain regions of the fin-type field-effect transistor. As used herein, the term "source/drain region" means sections of the two-dimensional material that can function as either a source or a drain of a field-effect transistor.

Middle-of-line (MOL) and back-end-of-line (BEOL) processing are subsequently used to form an interconnect structure that is coupled with the field-effect transistor.

The completed fin-type field-effect transistor includes replacement channel layers 44 containing two-dimensional material, instead of containing a semiconductor material (e.g., silicon) as in a conventional fin-type field-effect transistor. The substitution of the two-dimensional material for semiconductor material (e.g., silicon) may improve electrostatic control, and may permit further gate length scaling and contacted (poly) pitch (CPP) scaling. The arrangement of the layer 46 and the source/drain contacts 52 provides a wraparound-contact (WAC) that may improve contact resistance. Because the source/drain regions do not contain an epitaxial semiconductor material as in conventional fin-type field-effect transistors, the field-effect transistor including the replacement channel layers 44 of two-dimensional material is junction-less. Either n-type or p-type fin-type field-effect transistors may be formed by adjusting the doping of the two-dimensional material in layer 46 and the metal used to form the lower source/drain contacts 52. The replacement channel layers 44 have a height that is significantly greater than their thickness (i.e., width) similar to the dimensions of fins that provide channel regions in a conventional fin-type field-effect transistor, and the replacement channel layers 44 project upwardly from the substrate 14 and bottom dielectric isolation layer 26 in a manner similar to the fins that provide channel regions in a conventional fin-type field-effect transistor.

Figure 13:
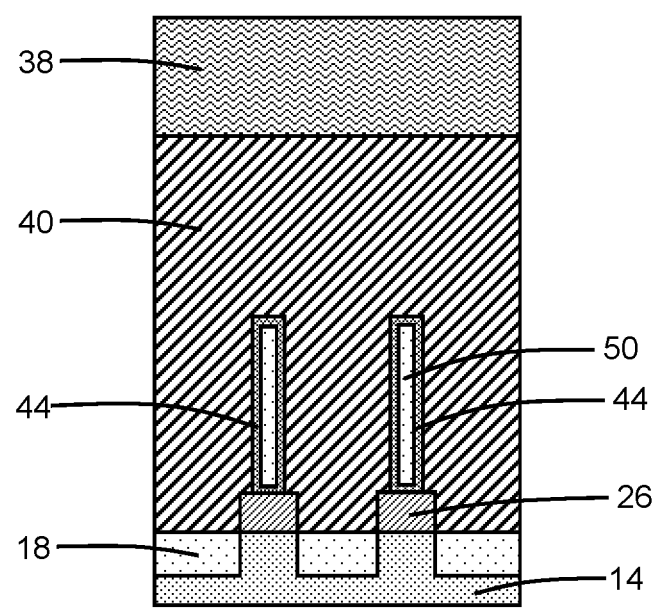
FIG. 13 is a cross-sectional view of a device structure in accordance with alternative embodiments of the invention.

With reference to FIG. 13 in which like reference numerals refer to like features in FIG. 12B and in an alternative embodiment, the deposited thickness of the two-dimensional material and/or the dimensions of the channel portions of the spaces 42 may be controlled such that the channel portions of the spaces 42 are only partially filled by the two-dimensional material of the replacement channel layers 44. Portions of the inner spacers 50 will deposit inside of these partially-filled channel portions of the spaces 42 when the inner spacers 50 are formed. Each replacement channel layer 44 defines a shell that surrounds the respective portion of the inner spacer 50 on all sides, and the portion of the inner spacer 50 provides an inner core of dielectric material surrounded on all sides by the replacement channel layer 44.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a channel layer;
   an inner spacer including a first portion adjacent to the channel layer and a second portion that is surrounded by the channel layer, the inner spacer comprised of a dielectric material;
   a source/drain region connected with the channel layer; and
   a gate structure extending across the channel layer,
   wherein the channel layer comprises a first portion of a layer of a two-dimensional material.

2. The structure of claim 1 wherein the two-dimensional material is a transition metal dichalcogenide.

3. The structure of claim 1 wherein the two-dimensional material is molybdenum disulphide, hafnium disulfide, zirconium disulfide, tungsten disulfide, tin sulfide, or tungsten diselenide.

4. The structure of claim 1 wherein the two-dimensional material is graphene.

5. The structure of claim 1 wherein the channel layer has a thickness of one nanometer to three nanometers.

6. The structure of claim 1 wherein the channel layer contains one monolayer of atoms to two monolayers of atoms.

7. The structure of claim 1 further comprising:
   a substrate; and
   a bottom dielectric isolation layer positioned between the channel layer and the substrate,
   wherein the channel layer is in direct contact with the bottom dielectric isolation layer.

8. The structure of claim 7 wherein the substrate comprises single-crystal silicon.

9. The structure of claim 7 further comprising:
   a sidewall spacer positioned adjacent to the gate structure,
   wherein the sidewall spacer and the bottom dielectric isolation layer are comprised of the same dielectric material.

10. The structure of claim 1 wherein the source/drain region is comprised of a second portion of the layer of the two-dimensional material.

11. The structure of claim 10 wherein the second portion of the layer of the two-dimensional material contains a dopant effective to increase an electrical conductivity of the two-dimensional material.

12. The structure of claim 10 further comprising:
   an extension region connecting the source/drain region with the channel layer, wherein the extension region is comprised of a third portion of the layer of the two-dimensional material.

13. The structure of claim 12 further comprising:
a contact coupled with the second portion of the layer of the two-dimensional material.

14. A structure comprising:
a channel layer comprising a first portion of a layer of a two-dimensional material;
a source/drain region connected with the channel layer, the source/drain region comprising a second portion of the layer of the two-dimensional material;
a gate structure extending across the channel layer;
an extension region connecting the source/drain region with the channel layer, the extension region comprised of a third portion of the layer of the two-dimensional material;
a contact coupled with the two-dimensional material of the source/drain region; and
a sidewall spacer positioned adjacent to the gate structure, wherein the second portion of the layer of the two-dimensional material is positioned between the sidewall spacer and the contact.

15. The structure of claim 14 wherein the second portion of the layer of the two-dimensional material contains a dopant effective to increase an electrical conductivity of the two-dimensional material.

16. A method of forming a field-effect transistor, the method comprising:
forming a sacrificial fin;
thinning a portion of the sacrificial fin to form a channel layer;
forming a gate structure that extends across the channel layer;
after forming the gate structure, removing the sacrificial fin to form a space; and
depositing a first portion of a layer of a two-dimensional material in the space to form a replacement channel layer.

17. The method of claim 16 wherein the first portion of the layer of the two-dimensional material fills a first portion of the space and a second portion of the space is surrounded by the first portion of the layer of the two-dimensional material, and further comprising:
after depositing the first portion of the layer of the two-dimensional material, depositing a dielectric material that fills the second portion of the space.

18. The method of claim 16 wherein a second portion of the layer of the two-dimensional material is deposited on a sidewall spacer adjacent to the gate structure to form a source/drain region that is connected with the channel layer, and further comprising:
introducing a dopant by a plasma doping process into the second portion of the layer of the two-dimensional material that is effective to increase an electrical conductivity of the two-dimensional material.

19. The method of claim 18 further comprising:
forming an inner spacer adjacent to the first portion of the layer of the two-dimensional material; and
forming a contact coupled with the second portion of the layer of the two-dimensional material,
wherein the first portion of the inner spacer is positioned between the channel layer and the contact, the inner spacer comprises a dielectric material, and a third portion of the layer of the two-dimensional material surrounds the inner spacer to define an extension region connecting the source/drain region with the channel layer.

20. The method of claim 18 further comprising:
forming a contact coupled with the second portion of the layer of the two-dimensional material,
wherein the sidewall spacer is positioned adjacent to the gate structure, the sidewall spacer is comprised of a dielectric material, and the second portion of the layer of the two-dimensional material is positioned between the sidewall spacer and the contact.

* * * * *